United States Patent [19]
Riddle

[11] 3,988,520
[45] Oct. 26, 1976

[54] THREE DIMENSIONAL IMAGE REPRODUCTION

[76] Inventor: Marlene A. Riddle, 8500 S. Welby Road, West Jordan, Utah 84084

[22] Filed: Oct. 6, 1975

[21] Appl. No.: 619,601

[52] U.S. Cl. .................................. 428/15; 96/40; 156/58; 156/59
[51] Int. Cl.$^2$ .................................. B44C 3/04
[58] Field of Search .................. 96/40 X, 41, 27; 156/58, 59; 428/15

[56] References Cited
UNITED STATES PATENTS

| | | | |
|---|---|---|---|
| 891,013 | 6/1968 | Smith | 156/58 |
| 2,066,996 | 1/1937 | Morioka | 156/85 |

*Primary Examiner*—Edward G. Whitby
*Attorney, Agent, or Firm*—Criddle, Thorpe & Western

[57] ABSTRACT

A three dimensional reproduction of an object is made by photographing the object at predetermined intervals by rotating the camera in a fixed plane 180° about a fixed axis which is at right angles to the plane of rotation. Each photograph is divided at a point perpendicular to the photograph and along the axis of rotation. Each photograph is then embedded in or affixed to a wedge shaped carvable material, the angle of the wedges being the same as the angle of rotation between photographs. The wedges are fitted together such that the dissected portions of each photograph meet each other at the common axis in a linear plane, and all wedges, when fitted together, form a 360° circle. The outlines of the photographed article in the composite of wedges represent substantially a three dimensional reproduction of the article. Each wedge, when carved along the outline, represented by the photograph, thus produces a substantially accurate three dimensional reproduction of the image photographed.

11 Claims, 13 Drawing Figures

THREE DIMENSIONAL IMAGE REPRODUCTION

BACKGROUND OF THE INVENTION

This invention relates to the three dimensional reproduction of an object or image. More particularly, this invention relates to a three dimensional reproduction of an object or image made by photographing the image at various angles about a common axis of rotation and through an assemblage of said photographs affixed to or embedded in a carvable material. A three dimensional object is outlined which may be carved along the outlines of the photograph in each wedge to produce a substantially three dimensional reproduction of the photographed object.

It is often the goal of sculptures, artists, designers, engineers, and other professions in both the arts and sciences, to reproduce as nearly as possible, a three dimensional image of both animate and inanimate objects. Such reproductions are often laborious and inexact, and result in a product that is often quite dissimilar from the original. For example, a sculpture may reflect the sculpturer's personal tastes and/or bias rather than producing an exact reproduction of the person or image being recreated. Oftentimes, an object having irregular surfaces is extremely difficult, if not impossible, to produce in three dimensional form.

It is, therefore, an object of the present invention to provide a method for reproducing an object in three dimensional form.

It is also an object of the invention to reproduce an object in three dimensional form which is a substantially exact reproduction of the original object.

It is a further object of the present invention to provide a process for preparing an object in three dimensional form by the use of photography.

It is a still further object of the present invention to provide an object in three dimensional form and the process for preparing such object by the use of photographic images which are affixed to or embedded in wedge shaped pieces which, when fit together, form a substantially complete outline of the object being reproduced. Each wedge can then be cut or carved along the outlines of the photographic images to reproduce the desired object.

The principal features of this invention include a three dimensional reproduction of an object and the method for accomplishing this, wherein the object to be reproduced is photographed at fixed intervals around 180° of a fixed axis. Each photograph is taken at the same distance from the axis and the degree of rotation of the camera between the taking of pictures is predetermined. The composite of pictures thus taken will present in outlined form the complete outer surface of the object being photographed.

The photograph used may be either a positive print or a negative and is divided perpendicular to the plane of the photograph at a point which would dissect the axis. Each portion of the photograph is attached to or embedded into a wedge shaped carvable material, i.e., wax or a soft plastic. The angle of each wedge is equal to the angle or number of degrees of rotation the camera was moved in taking each picture. Thus, if the camera was moved one degree for each picture taken, there would be 360 wedges to fit together, or in the alternative, if a photograph was taken every 10° of rotation there would be only 36 wedges to fit together. Preferably, the angle of rotation between photographs will be from 1 to 10°. The point of each wedge joins together at the axis of rotation and the sides of each divided photograph fit together in a linear plane. When all of the wedges are placed together, a three dimensional image in outlined form is obtained embedded in the wedged pieces which may be in the form of a cylinder or sphere. The outline of the profile in each wedge is then carved by hand or mechanical means, and after the outline in each wedge has been cut, a three dimensional image, which is essentially an exact reproduction of the original, will be reproduced. The image thus produced can then be further carved, smoothed, or refinished to reproduce a more exact likeness of the original image and then be used as the final product or as a means for making a mold whereby further reproductions can be made.

The novel features of this invention, both as to the manner of construction or organization of the wedges, as well as the manner of cutting or carving the figure, will be better understood with reference to the following description and drawings. It is to be understood, however, that the description and drawings are for the purposes of illustration only and are not intended to be a definition as to the scope of the invention.

DRAWINGS OF THE INVENTION

DETAILED DESCRIPTION OF THE INVENTION

Figure 1:
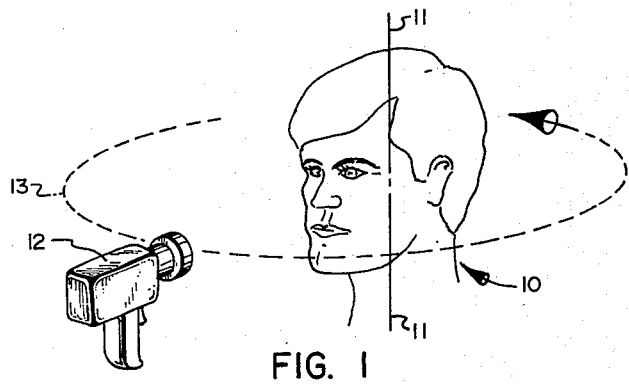
FIG. 1 is a perspective view of an image to be photographed showing the axis of rotation and the plane of rotation of the camera around the image.

Referring now to the drawings:

There is shown in FIG. 1 a perspective view of an image 10 having an axis or fixed location about which camera 12 will rotate. As illustrated, camera 12 will rotate about a fixed horizontal plane 13 around a 180° angle. The distance from axis 11 to lens of camera 12 will remain constant. Camera 12 may be either a movie camera which would take pictures at a constant rate during the 180° rotation; on the other hand, the camera could be "still" camera wherein a picture could be taken after every so many degrees of rotation. Obviously, the more pictures that are taken the more accurate will be the reproduction in the finished product. Each picture taken will represent in profile a photograph at the particular angle at which the picture is taken. For purposes of this invention, the photograph can be used in either a positive or negative image form. It can be seen that upon a 180° rotation, a complete outline in profile of the image being photographed will be obtained. Although the invention as described presumes the taking of pictures around a 180° angle, it will be at once obvious that pictures could be taken around a 360° angle, and like profiles, superimposed upon each other, i.e., profiles taken at 180° angles. If desired, only one-half of a profile taken from a 360° angle of rotation could be used by selecting either the right side or left side of the profile as divided at the axis line as will be hereinafter described. What is important to the invention is that a complete profile outline of the object being photographed be obtained with a sufficient number of photographs so that when put together as hereinafter described, a substantially complete three dimensional image will be visible for reproduction. Obviously, the closer together the photographs are the more accurate the reproduction will be.

Figure 2:
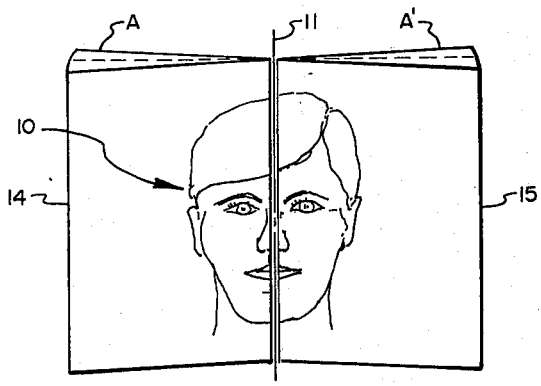
FIG. 2 is a front elevational view of the image thus photographed embedded in a transparent wedge shaped material and divided into two pieces.
Figure 6:
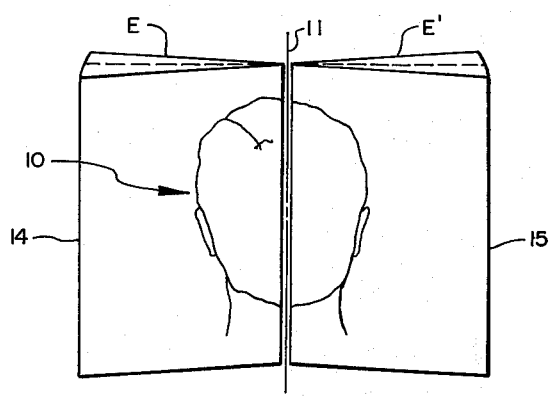
FIG. 6 is a rear elevational view of the image shown in FIG. 2 rotated 180°.

FIGS. 2 and 6 show photographs of profiles taken at 45° intervals. These are for purposes of illustration only as it is at once obvious that photographs would be taken much more closely together than as illustrated in the Figures. As illustrated in each of FIGS. 2 through 6, a complete profile of image 10 is formed in either positive or negative form and the photograph is divided along axis 11 into two parts 14 and 15. Each side of the photograph 14 and 15 is then affixed to or embedded in a wedge shaped piece of carvable material such that the edge of a photograph along axis line 11 exactly meets the pointed edge of the wedge to which it is affixed. The wedge shaped material may be a carvable material which is either sufficiently transparent or translucent to allow a visible detection of the outline of each photograph affixed thereto, or if desired, the photograph may be laminated or embedded into said material. If the outline is being electronically, magnetically or otherwise traced, the material is of such a nature that the outline can be traced and recorded by coded signals. Preferably, materials used will be plasticized polymers, waxes or wax polymer mixtures, which can be readily carved, but of which are of sufficient hardness to maintain their shape.

Figure 2A:
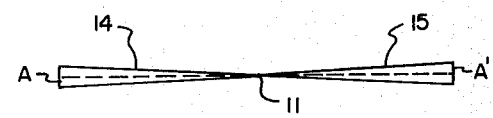
FIG. 2a is a top plan view of FIG. 2 wherein the wedge shaped pieces meet at a common axis.
Figure 3:
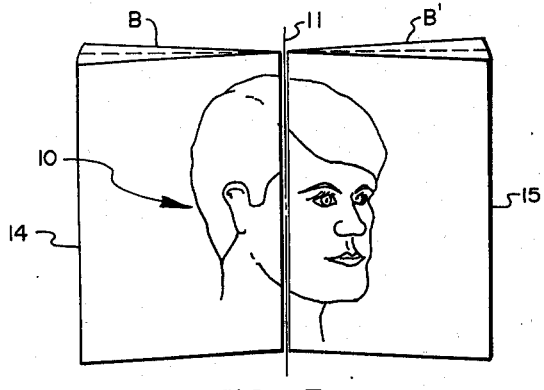
FIG. 3 is a front angular elevational view of the figures shown in FIG. 1 rotated 45° and divided into wedge form.
Figure 3A:
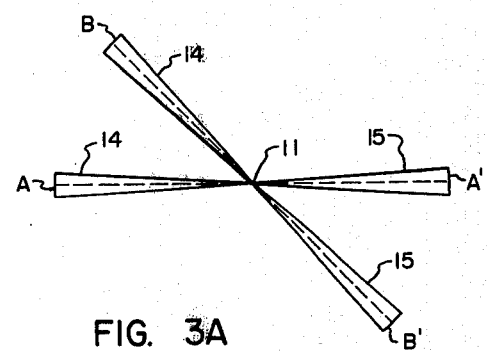
FIG. 3a is a top plan view of a combination of the wedges made up of FIGS. 2 and 3, meeting at a common axis.
Figure 4:
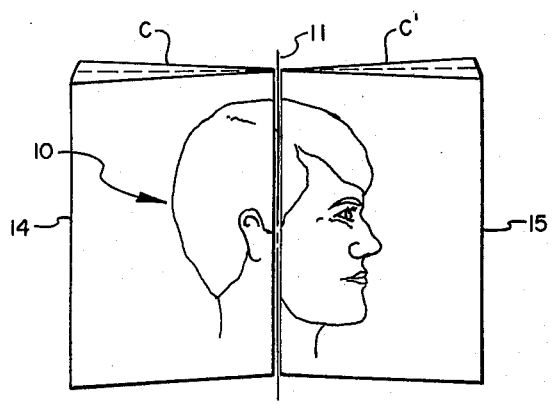
FIG. 4 is a side elevational view of the image shown in FIG. 1 rotated 90° and divided into wedges.
Figure 4A:
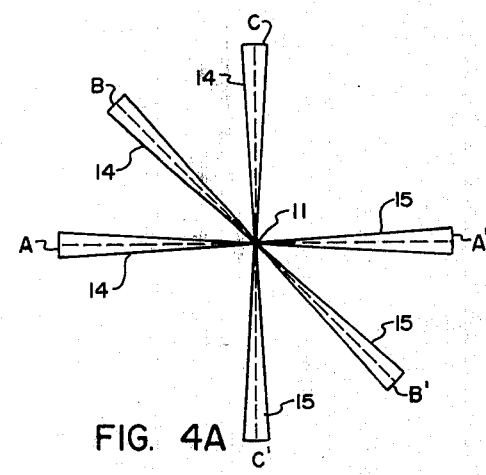
FIG. 4a is a top plan view of a combination of the wedges shown in FIGS. 2, 3 and 4, meeting at a common axis.
Figure 5:
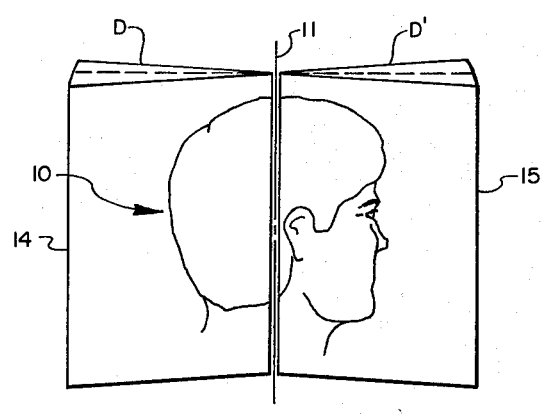
FIG. 5 is a rear angular view of the image shown in FIG. 2 rotated 135° and divided into wedges.
Figure 5A:
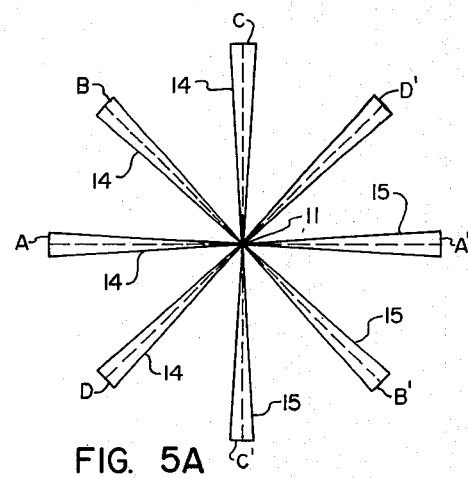
FIG. 5a is a top plan view of the wedges shown in FIGS. 2 through 5, meeting at a common axis.
Figure 6A:
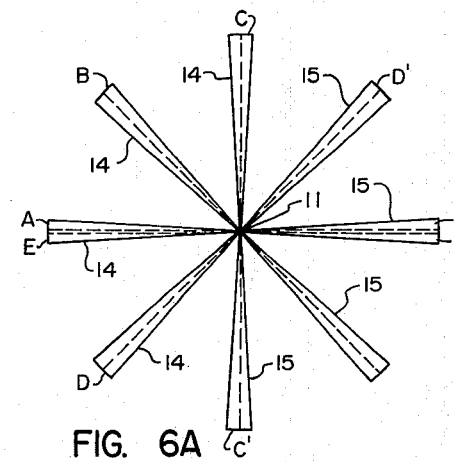
FIG. 6a is a top plan view of a combination of the wedges illustrated in FIGS. 2 through 6, all meeting at a common axis.

As illustrated in FIGS. 2 through 6, each portion of the photograph 14 and 15 as divided along axis 11 is embedded into a wedge shaped piece designated as A and A' for FIG. 2 through E and E' for FIG. 6. Each wedge shaped piece will be fit together as illustrated in FIGS. 2a through 6a. Each photographic profile, separated into sections 14 and 15, will be aligned as shown in FIG. 2a which is a top view illustrating a photograph divided into sections 14 and 15 and meeting at axis 11. FIG. 3a is a combination of wedges A and A' and B and B', separated at 45° angles meeting at axis 11. FIG. 4a likewise is a combination of wedges A and A', B and B' and C and C', all of which are at 45° angles from each other. FIG. 5a is a representation of wedges A and A' through D and D', showing a complete profile at 45° angles, and FIG. 6a is a representation completing a 180° representation of profiles as illustrated by wedges A and A' through E and E'. It will be noted that wedges A and E' can be the same with the photographs superimposed on each other since they are taken at 180° angles. Likewise, wedge E and A' can be the same as illustrated in the drawings. A and A' represent a front elevational view of a facial image wherein wedges E and E' represent a back view of the head of the image being photographed.

Figure 7:
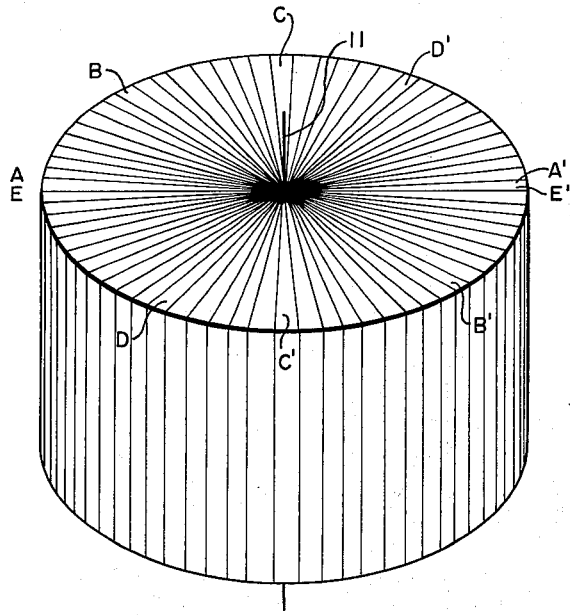
FIG. 7 is a representation of a completely fitted together wedged cylinder containing a completed circle of photographic outlines of the images to be reproduced.

FIG. 7 illustrates a completed cylinder of wedged forms, however, the wedges as illustrated are not indicative of the number of wedges that would be utilized in the preferred embodiment of the invention. This, of course, would depend entirely upon the size of the image to be reproduced, and how thin the wedges can be at the axis 11. Obviously, the point of the wedge at axis 11 need be no bigger than the thickness of the photograph. In a preferred embodiment, at the point of outine or carvable surface, the wedges may be on the order of from about 1/32 to ¼ inch apart, again depending upon the size of the article being reproduced. This data can be translated by one having ordinary skill in the art into degrees of rotation. The wedges may be laminated or glued together by means known in the art. For example, there are many glues specific to various types of plastics. On the other hand, waxes or wax polymers may be heat sealed or fused together.

Once the image has been completely embedded into wedge shaped pieces, and fitted together to form a cylinder or the like, it is then ready to be reproduced by cutting, carving, sanding or whatever type of cutting action is deemed to be necessary. The wedges can be cut separately or several wedges can be cut at a time. If desired, each wedge can be cut to the outline of the photograph before being fit together. The particular type of knives, cutters, tools, etc. used in cutting each wedge to the outline of the photograph is not a limiting factor to the present invention. Obviously, the operation may be carried out by hand or by the use of mechanical means such as sanders, drills, planes, and the like.

It is also possible that the operation may be computerized by plotting the outline on each wedge on an $x\ y$ coordinate and designing a computer program which will then actuate cutting means to cut each wedge along the outline thereby forming a reproduction of the image as has been described.

Figure 8:
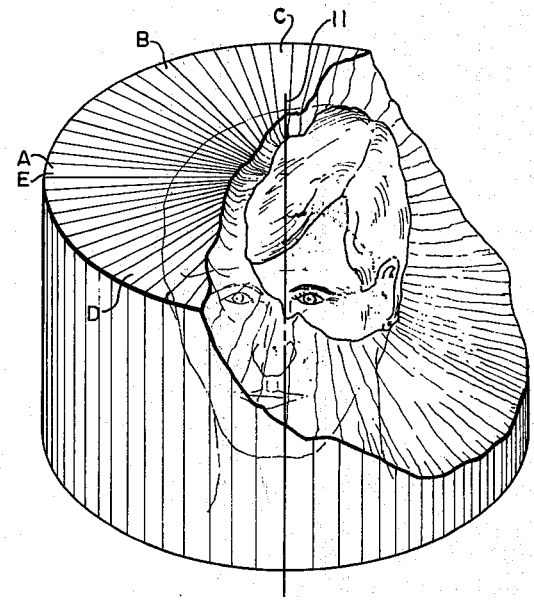
FIG. 8 is a partially cutaway view of the image embedded in FIG. 7, illustrating how the outline in each wedge can be carved to reproduce a three dimensional image.

FIG. 8 is a representation of a partially carved away series of wedges exposing a portion of the image 10a which is a reproduction of image 10 as photographed.

It is obvious that once a complete image has been obtained by cutting each wedge along the outline, a perfect reproduction of the image will still not be obtained and the further apart the photographed portions are, the less accurate will be the reproduction. However, the likeness will be more exact than can be obtained by "freehand" means and can then be retouched or refinished to reproduce a substantially exact replica of the original image photographed.

It will also be obvious that many uses can be made of such a reproduction. For example, the reproduction itself can be coated or painted, or in the alternative, may be used as a model from which to make a mold to cast other reproductions in plastic, metal, or other molten or liquid material.

One distinct advantage of the present invention is that exact reproduction can be made in substantially any size. For example, photographs can be taken and then enlarged or made smaller to reproduce an image which will be either larger or smaller than the original object photographed. Such reproductions can be invaluable in the study of anatomy or in the reproduction of inanimate objects such as gems, crystal formations and the like. On the other hand, reduced images of larger objects can also be reproduced on the smaller scale.

Although the invention as has been described is deemed to be that which would form the preferred embodiment, it is recognized that departures may be made therefrom without departing from the scope of the invention, which is not to be limited to the details disclosed, but is to be afforded the full scope of the claims so as to include any and all equivalent devices, procedures and apparatus.

I claim:

1. A method for the three dimensional reproduction of an image which comprises steps of:
   a. photographing the image at specified angles of rotation over 180° in a fixed plane about a fixed axis,
   b. dividing the photographs thus obtained at the axis of rotation into two separate parts,
   c. affixing each part of the divided photograph to a wedge shaped carvable material such that the side of the photograph forming the axis of rotation is at the pointed edge of the wedge, the angle of the wedge being the same as the angle of rotation between photographs, the wedge being made of such material that the outline of the photographed image is visible therein,
   d. assembling each wedge into place so that the points of the wedges meet at a common axis of rotation and the divided photographs meet in a linear plane such that a 360° representation in outline form of the image is presented in the assembled wedges, and
   e. carving each wedge along the outline of the photograph contained therein to obtain a three-dimensional reproduction of the image photographed.

2. A method for the three dimensional reproduction of an image according to claim 1 wherein the carvable material is selected from the group consisting of wax, wax-polymer mixtures and polymers.

3. A method for the three dimensional reproduction of an image according to claim 2 wherein the angle of rotation between photographs is between one and ten degrees.

4. A method for the three dimensional reproduction of an image according to claim 3 wherein the photographs are enlarged prior to being affixed to the carvable material.

5. A method for the three dimensional reproduction of an image according to claim 3 wherein the photographs are reduced in size prior to being affixed to the carvable material.

6. A method for the three dimensional reproduction of an image according to claim 3 wherein the photographs are embedded into the carvable material.

7. A method for the three dimensional reproduction of an image according to claim 3 wherein adjacent wedges are secured to each other by a sealing means.

8. A method for the three dimensional reproduction of an image according to claim 7 wherein the carvable material is a plastic and the sealing means is a transparent glue.

9. A method for the three dimensional reproduction of an image according to claim 6 wherein the carvable material is a wax containing mixture and the wedges are heat sealed together.

10. A method for the three dimensional reproduction of an image according to claim 3 wherein the carved three dimensional image is used as a means for making a mold whereby further reproductions of the image may be made.

11. A three dimensional image produced by the method of claim 3.

* * * * *